(12) United States Patent
Kang

(10) Patent No.: US 8,373,457 B2
(45) Date of Patent: Feb. 12, 2013

(54) POWER-UP SIGNAL GENERATION CIRCUIT IN SEMICONDUCTOR INTEGRATED CIRCUIT

(75) Inventor: Dong-Geum Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 126 days.

(21) Appl. No.: 12/648,315

(22) Filed: Dec. 29, 2009

(65) Prior Publication Data

US 2011/0156769 A1 Jun. 30, 2011

(30) Foreign Application Priority Data

Dec. 24, 2009 (KR) .................. 10-2009-0131136

(51) Int. Cl.
*H03L 7/00* (2006.01)
(52) U.S. Cl. ........................ 327/142; 327/198
(58) Field of Classification Search .................. 327/142, 327/143, 198
See application file for complete search history.

(56) References Cited

U.S. PATENT DOCUMENTS

| | | | | |
|---|---|---|---|---|
| 5,528,182 A * | 6/1996 | Yokosawa | ...................... | 327/143 |
| 5,742,183 A * | 4/1998 | Kuroda | ........................... | 326/81 |
| 6,377,090 B1 * | 4/2002 | Bruno | ........................... | 327/143 |
| 6,441,674 B1 * | 8/2002 | Lin | ................ | 327/512 |
| 7,184,349 B2 * | 2/2007 | Sako | ........................... | 365/212 |
| 7,212,046 B2 * | 5/2007 | Hur | ................ | 327/143 |
| 7,777,560 B2 * | 8/2010 | Kang | ........................... | 327/541 |
| 7,813,205 B2 * | 10/2010 | Sako | ........................... | 365/222 |
| 7,868,668 B2 * | 1/2011 | Kao et al. | ...................... | 327/143 |
| 2004/0239383 A1 * | 12/2004 | Kang | ........................... | 327/143 |
| 2005/0093590 A1 * | 5/2005 | Jang | ........................... | 327/143 |
| 2009/0091311 A1 * | 4/2009 | Kang | ........................... | 323/313 |

FOREIGN PATENT DOCUMENTS

| | | | |
|---|---|---|---|
| KP | 1020080000219 A | * | 2/2008 |
| KR | 1020020056262 | | 7/2002 |
| KR | 1020040035065 | | 4/2004 |
| KR | 1020080000219 | | 1/2008 |

OTHER PUBLICATIONS

Notice of Allowance issued from Korean Intellectual Property Office on Nov. 29, 2011.

* cited by examiner

*Primary Examiner* — Ryan Jager
(74) *Attorney, Agent, or Firm* — IP & T Group LLP

(57) ABSTRACT

A power-up signal generation circuit includes a main driving unit configured to drive a power-up detection node according to power supply voltage level information; an auxiliary driving unit configured to additionally drive the power-up detection node according to temperature information; and an output unit configured to output a power-up signal in response to a voltage change of the power-up detection node in accordance with the operations of the main driving unit and the auxiliary driving unit.

13 Claims, 6 Drawing Sheets

POWER-UP SIGNAL GENERATION CIRCUIT IN SEMICONDUCTOR INTEGRATED CIRCUIT

CROSS-REFERENCE TO RELATED APPLICATIONS

The present application claims priority of Korean Patent Application No. 10-2009-0131136, filed on Dec. 24, 2009, which is incorporated herein by reference in its entirety.

BACKGROUND OF THE INVENTION

Exemplary embodiments of the present invention relate to semiconductor design technology, and more particularly, to a power-up signal generation circuit in a semiconductor integrated circuit.

A semiconductor integrated circuit (IC) includes an internal power supply voltage generation unit configured to stably operate various internal logic circuitry and other elements. The internal power supply voltage generation unit supplies internal power supply voltages to power terminals of the internal logic circuitry. When the internal power supply voltages have a proper voltage level during the application of an external power supply voltage, problems, such as latch-up, occur. In this case, it is difficult to guarantee the reliability of the semiconductor IC.

When the internal logic circuitry is not initialized to a specific value before power supply voltages are supplied to operate the elements thereof, a failure may occur due to a false data input and output during the operation of the IC. Therefore, a circuit to initialize the internal logic circuitry before the operation of the IC is required.

To prevent the latch up caused by the instability of the internal power supply voltage and to initialize the internal logic circuitry, the semiconductor IC includes a power-up signal generation circuit configured to generate a power-up signal.

FIG. 1 is a block diagram of a power-up signal generation circuit of a conventional semiconductor IC.

Referring to FIG. 1, the power-up signal generation circuit includes an external power supply voltage detection unit 110, an internal power supply voltage detection unit 120, and a combination unit 130. The external power supply voltage detection unit 110 is configured to detect a voltage level of an external power supply voltage VEXT and to generate a first power-up signal PUPB. The internal power supply voltage detection unit 120 is configured to detect a voltage level of an internal power supply voltage VINT and to generate a second power-up signal PUPBP. The combination unit 130 is configured to combine the first power-up signal PUPB and the second power-up signal PUPBP and to generate a final power-up signal PWRUP.

FIG. 2 is a waveform diagram of the power-up generation circuit of FIG. 1.

Referring to FIG. 2, power is externally supplied to increase the external power supply voltage VEXT. When the level of the external power supply voltage VEXT approaches a preset level, the external power supply voltage detection unit 110 detects the level such that the first power-up signal PUPB changes from a logic low level to a logic high level.

When the first power-up signal PUPB has changed to a logic high level, the internal power supply voltage generation unit is enabled to operate in response to the first power-up signal PUPB. Accordingly, the internal power supply voltage VINT increases.

When the internal power supply voltage increases to a stable level, the internal power supply voltage detection unit 120 detects the level such that the second power-up signal PUPBP changes from a logic low level to a logic high level.

The combination unit 130 changes the final power-up signal PWRUP from a logic low level to a logic high level in response to both the first and second power-up signals PUPB and PUPBP being changed from a logic low level to a logic high level. Therefore, when the final power-up signal PWRUP has changed from a logic low level to a logic high level, the internal logic circuitry of the semiconductor IC is activated.

FIG. 3 illustrates a circuit configuration of the internal power supply detection unit 120 of the conventional power-up signal generation circuit.

Referring to FIG. 3, the internal power supply detection unit 120 includes a block configured to lower a voltage of a detection node NC, a block configured to raise a voltage of the detection node NC, and a block configured to output the second power-up signal PUPBP in response to a voltage change of the detection node NC.

The block configured to lower a voltage of the detection node NC includes a PMOS transistor MP1, an NMOS transistor MN1, and a NMOS transistor MN2. The PMOS transistor MP1 has a source connected to the external power supply terminal VEXT and a drain connected to a node NA, and receives a ground voltage from a ground voltage terminal VSS through a gate thereof. The NMOS transistor MN1 has a source connected to the ground voltage terminal VSS and a drain and gate connected to the node NA. The NMOS transistor MN2 has a source connected to the ground voltage terminal VSS, a drain connected to the detection node NC, and a gate connected to the node NA.

The block configured to raise a voltage of the detection node NC includes a PMOS transistor MP2 and a PMOS transistor MP3. The PMOS transistor MP2 has a source connected to an internal power supply voltage terminal VINT and a drain and gate connected to a node NB. The PMOS transistor MP3 has a source connected to the node NB and a drain connected to the detection node NC, and receives a ground voltage from the ground voltage terminal VSS through a gate thereof.

The block configured to output the second power-up signal PUPBP in response to a voltage change of the detection node NC includes an inverter INV1, a PMOS transistor MP4, and an inverter INV2. The inverter INV1 has an input terminal connected to the detection node NC. The PMOS transistor MP4 has a source connected to the internal power supply voltage terminal VINT, a drain connected to the detection node NC, and a gate connected to an output node ND of the inverter INV1. The inverter INV2 has an input terminal connected to the output node ND, and outputs the second power-up signal PUPBP.

When the external power supply voltage VEXT is supplied in accordance with a power-up sequence, the voltage of the node NA increases to a threshold voltage Vth of the NMOS transistor MN1. Accordingly, the NMOS transistor MN2 is turned on to lower the voltage level of the detection node NC.

When the internal power supply voltage generation unit operates to increase the voltage level of the internal power supply voltage VINT, the PMOS transistor MP2 is turned on to increase the voltage level of the detection node NC. At this time, the discharge drive of the detection node NC by the NMOS transistor MN2 is continuously maintained. However, since the voltage level raising ability of the two PMOS transistors MP2 and MP3 is greater than the voltage level lowering ability of the NMOS transistor MN2, the voltage level of the detection node NC increases.

As such, when the level of the detection node NC increases to exceed a logic threshold value of the inverter INV1, the second power-up signal PUPBP changes to a logic high level. Since the node ND changes to a logic low level, the transistor MP4 is turned on to latch the detection node NC to a logic high level.

However, since the MOS transistor has a temperature characteristic, the threshold voltage decreases with a temperature increase (−2 mV/° C.). That is, at a high temperature, the threshold voltage decreases in comparison with the threshold voltage at a normal temperature. On the other hand, at a low temperature, the threshold voltage increases in comparison with a normal temperature.

Therefore, the threshold voltage Vth of the NMOS transistor NM1 increases in a low-temperature environment. This means that the voltage level of the node NA increases, and the voltage level lowering ability of the NMOS transistor NM2 for the detection node NC is improved by an increase of the gate voltage. On the other hand, since the threshold voltages Vth of the two PMOS transistors MP2 and MP3 also increase, the voltage level raising ability of the two PMOS transistors MP2 and MP3 for the detection node NC is reduced. In this case, the voltage of the detection node NC may not increase sufficiently. In a severe case, since the voltage of the detection node NC does not exceed the logic threshold value of the inverter INV1, the second power-up signal PUPBP does not change to a logic high level. When the second power-up signal PUPBP does not change to a logic high level, the final power-up signal PWRUP is not activated. Then, since the internal logic circuitry of the semiconductor IC is not initialized, a malfunction may occur.

SUMMARY OF THE INVENTION

An embodiment of the present invention is directed to a power-up signal generation circuit of a semiconductor integrated circuit which prevents a malfunction caused by a variation in the threshold voltage of MOS transistors due to a temperature change.

In accordance with an embodiment of the present invention, a power-up signal generation circuit of a semiconductor integrated circuit (IC) includes: a main driving unit configured to drive a power-up detection node according to power supply voltage level information; an auxiliary driving unit configured to additionally drive the power-up detection node according to temperature information; and an output unit configured to output a power-up signal in response to a voltage change of the power-up detection node in response to being driven by the main driving unit and the auxiliary driving unit.

In accordance with another embodiment of the present invention, a power-up signal generation circuit of a semiconductor device includes: a discharge driving unit configured to lower a voltage of a power-up detection node according to an external power supply voltage level; a charge driving unit configured to raise a voltage of the power-up detection node according to an internal power supply voltage level; an auxiliary charge driving unit configured to additionally raise a voltage of the power-up detection node according to temperature information; and an output unit configured to output a first power-up signal in response to a voltage change of the power-up detection node.

When the auxiliary driving circuit configured to additionally drive the power-up detection node to compensate for a temperature change is added to the power-up signal generation circuit, malfunctions of the semiconductor integrated circuit caused by a power-up signal generation error can be avoided.

DESCRIPTION OF INVENTION

Figure 1:
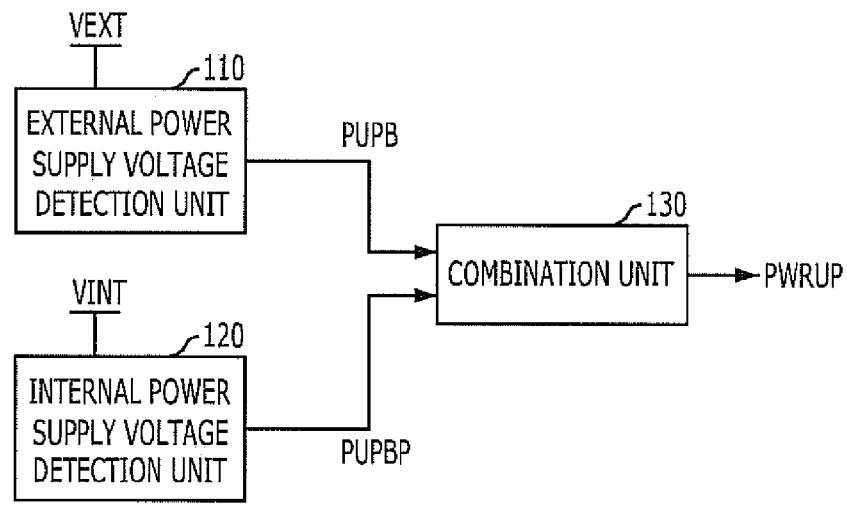
FIG. 1 is a block diagram of a power-up signal generation circuit of a conventional semiconductor integrated circuit (IC).
Figure 2:
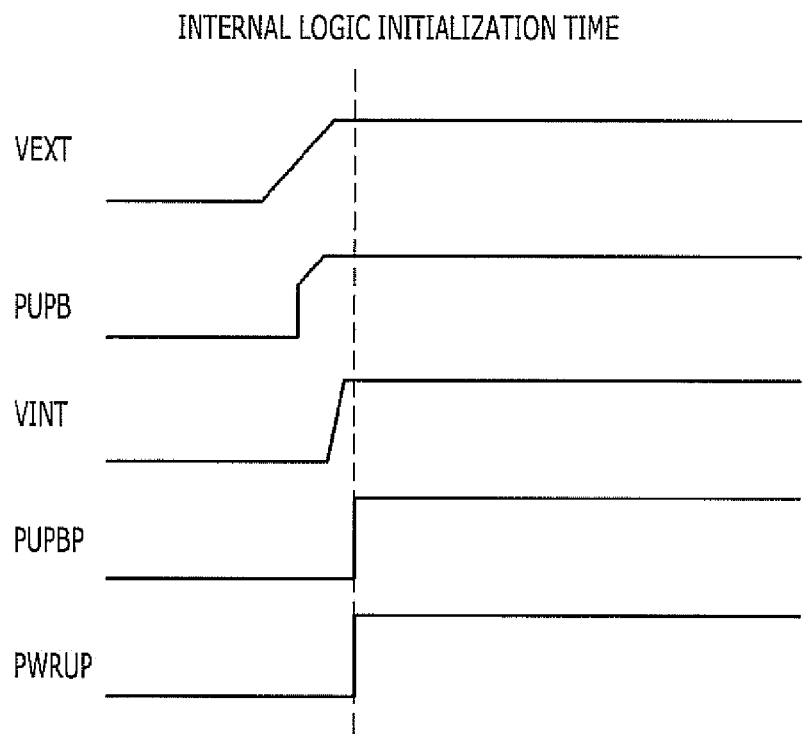
FIG. 2 is an operation waveform diagram of the power-up generation circuit of FIG. 1.
Figure 3:
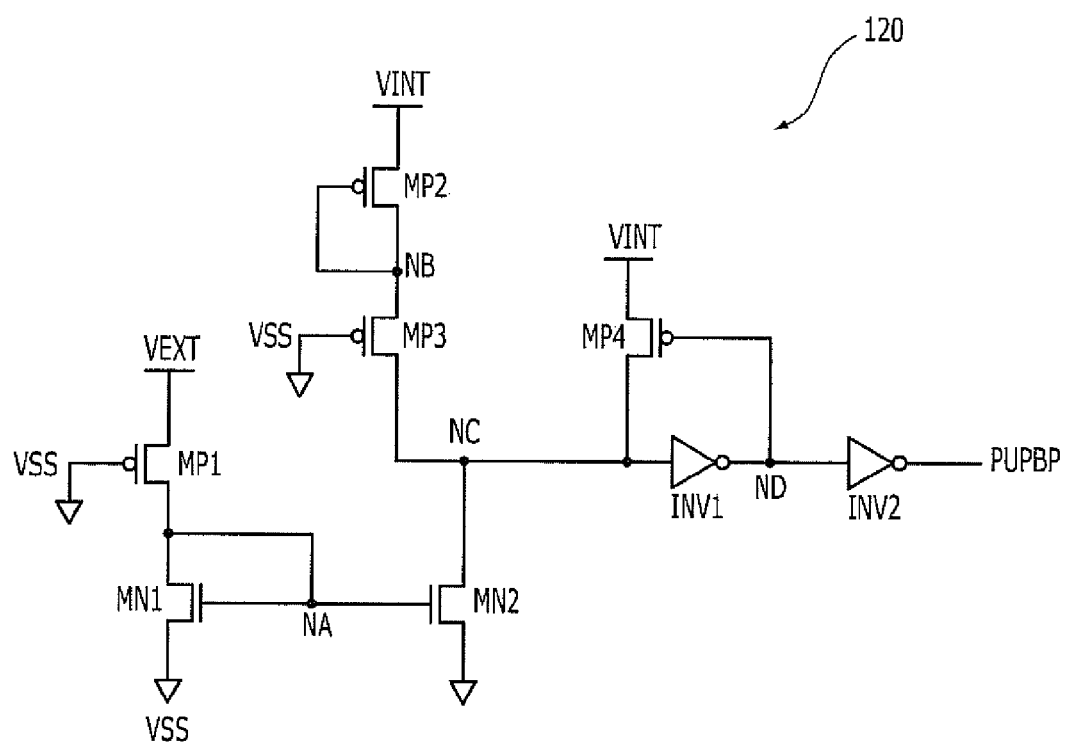
FIG. 3 illustrates a circuit configuration of an internal power supply detection unit of the conventional power-up signal generation circuit.

Exemplary embodiments of the present invention are described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various drawing figures and embodiments of the present invention.

Figure 4:
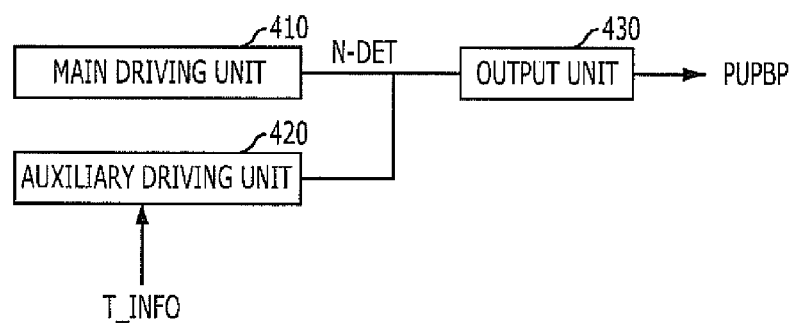
FIG. 4 is a block diagram of a power-up signal generation circuit of a semiconductor IC in accordance with an embodiment of the present invention.

FIG. 4 is a block diagram of a power-up signal generation circuit of a semiconductor integrated circuit (IC) in accordance with an embodiment of the present invention.

Referring to FIG. 4, the power-up signal generation circuit of a semiconductor IC in accordance with this embodiment of the present invention includes a main driving unit 410 configured to drive a power-up detection node N_DET in accordance with power supply voltage level information, an auxiliary driving unit 420 configured to additionally drive the power-up detection node N_DET in accordance with temperature information T_INFO, and an output unit 430 configured to output a power-up signal PUPBP in response to a voltage change of the power-up detection node N_DET in response to being driven by the main driving unit 410 and the auxiliary driving unit 420.

In accordance with a power-up sequence, the main driving unit 410 detects a power supply voltage level to drive the power-up detection node N_DET. The output unit 430 outputs a level of the power signal PUPBP as a logic low or a logic high level according to the voltage of the power-up detection node N_DET. The auxiliary driving unit 420 additionally drives the power-up detection node N_DET according to the temperature information T_INFO obtained by reflecting a current temperature of the semiconductor IC, in order to support the main driving unit 410. In particular, the auxiliary driving unit 420 additionally drives the power-up detection node N_DET in response to the temperature information T_INFO indicating a low-temperature environment.

Figure 5:
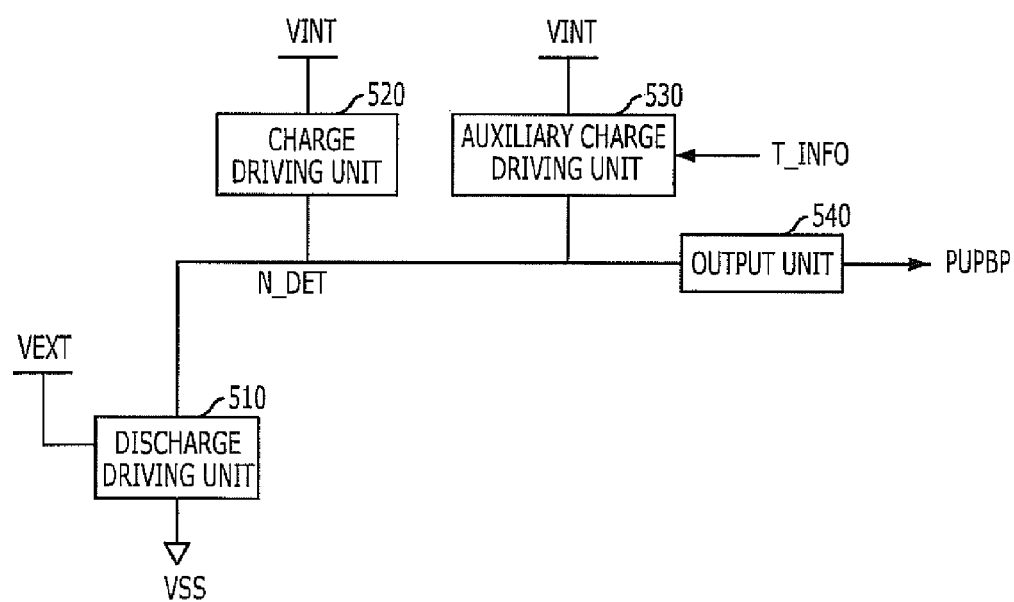
FIG. 5 is a block diagram of a power-up signal generation circuit of a semiconductor IC in accordance with another embodiment of the present invention.

FIG. 5 is a block diagram of a power-up signal generation circuit of a semiconductor IC in accordance with another embodiment of the present invention.

Referring to FIG. 5, the power-up signal generation circuit of a semiconductor IC in accordance with this embodiment of the present invention includes a discharge driving unit 510, a charge driving unit 520, an auxiliary charge driving unit 530, and an output unit 540. The discharge driving unit 510 is configured to lower a voltage of a power-up detection node N_DET according to a level of an external power supply voltage VEXT. The charge driving unit 520 is configured to raise a voltage of the power-up detection node N_DET according to a level of an internal power supply voltage VINT. The auxiliary charge driving unit 530 is configured to additionally raise a voltage of the power-up detection node N_DET according to the temperature information T_INFO. The output unit 540 is configured to output a power-up signal PUPBP in response to a voltage change of the power-up detection node N_DET.

When the external power supply voltage VEXT is supplied in accordance with a power-up sequence, the discharge driving unit 510 detects the external power supply voltage VEXT to lower the voltage of the power-up detection node N_DET.

When an internal power supply voltage generation unit operates to raise the level of the internal power supply voltage VINT, the charge driving unit 520 raises a voltage of the power-up detection node N_DET to increase the voltage of the power-up detection node N_DET. When the level of the power-up detection node N_DET exceeds a preset level, the output unit 540 outputs a high logic level power-up signal PUPBP.

In a low-temperature environment, temperature information T_INFO enables the auxiliary charge driving unit 530 to additionally raise the voltage of the power-up detection node N_DET. As such, the additional charge drive of the power-up detection node N_DET by the auxiliary charge driving unit 530 compensates for the operation characteristic changes of the discharge driving unit 510 and the charge driving unit 520 under the low-temperature environment.

The power-up signal generation circuits of FIGS. 4 and 5 correspond to the internal power supply voltage detection unit 120 of FIG. 1. Although the internal power supply voltage detection unit 120 can independently generate a power-up signal, the external power supply detection unit 110 and the combination unit 130 may be further provided to generate a power-up signal. The combination unit 130 may include an AND circuit such that the final power-up signal PWRUP outputs a high logic level in response to both the power-up signal PUPB and the power-up signal PUPBP being at a logic high level.

Figure 6:
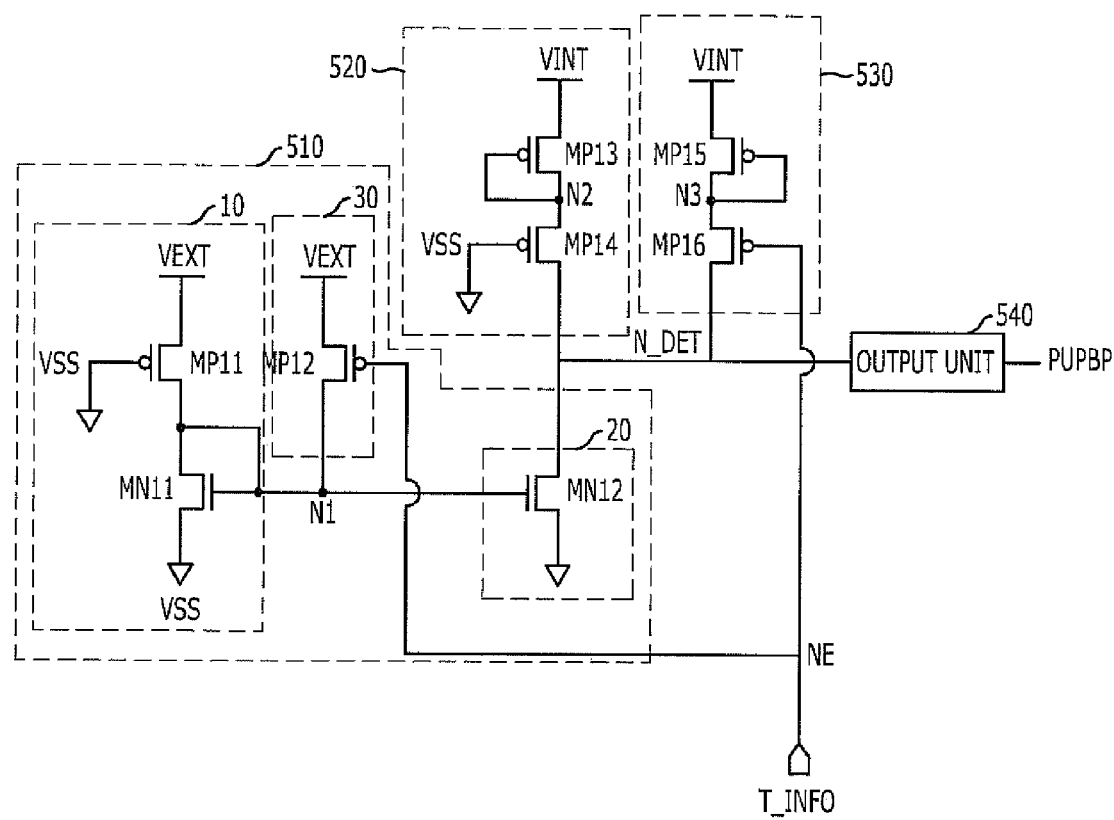
FIG. 6 is a diagram illustrating an example of the power-up signal generation circuit of FIG. 5.

FIG. 6 is a diagram illustrating an example of the power-up signal generation circuit of FIG. 5.

Referring to FIG. 6, the charge driving unit 510 of the power-up signal generation circuit includes a discharge control unit 10 and a driving unit 20. The discharge control unit 10 is configured to control a discharge drive start time in response to the level of an external power supply voltage VEXT. The driving unit 20 is configured to raise a voltage of the power-up detection node N_DET in accordance with the control of the discharge control unit 10.

The discharge driving unit 510 of the power-up signal generation circuit may further include an auxiliary discharge control unit 30 configured to advance the discharge drive start time in a low-temperature environment in response to the temperature information T_INFO.

The discharge control unit 10 may include a PMOS transistor PM11 and a NMOS transistor NM11. The PMOS transistor P11 has a source connected to an external power supply voltage terminal VEXT and a drain connected to a node N1, and receives a ground voltage VSS through a gate thereof. The NMOS transistor NM11 has a source connected to a ground voltage terminal VSS and a drain and gate connected to the node N1.

The driving unit 20 may include a NMOS transistor NM2 having a source connected to the power-up detection node N_DET, and a gate connected to the node N1.

The auxiliary discharge control unit 30 may include a PMOS transistor MP12 having a source connected to the external power supply voltage terminal VEXT and a drain connected to the node N1 and receiving the temperature information T_INFO through a gate thereof.

The charge driving unit 520 of the power-up signal generation circuit may include a PMOS transistor MP13 and a PMOS transistor MP14. The PMOS transistor MP13 has a source connected to an internal power supply voltage terminal VINT and a drain and gate connected to a node N2. The PMOS transistor MP14 has a source connected to the node N2 and a drain connected to the power-up detection node N_DET, and receives a ground voltage VSS through a gate thereof.

The auxiliary charge driving unit 530 of the power-up signal generation circuit may include a PMOS transistor MP15 and a PMOS transistor MP16. The PMOS transistor MP15 has a source connected to an internal power supply voltage terminal VINT and a drain and gate connected to a node N3. The PMOS transistor MP16 has a source connected to the node N3 and a drain connected to the power-up detection node N_DET, and receives the temperature information T_INFO through a gate thereof.

When an external power supply voltage VEXT is supplied in accordance with the power-up sequence, the voltage of the node N1 increases to the threshold voltage Vth of the NMOS transistor MN11. Accordingly, the NMOS transistor Mn12 is turned on to lower the voltage level of the power-up detection node N_DET.

In a low-temperature environment, the temperature information T_INFO is set to a logic low level to turn on the PMOS transistor MP12 of the auxiliary discharge control unit 30. In this case, since the voltage of the node N1 is quickly set to the threshold voltage Vth by the PMOS transistor MP12, it is possible to compensate for a reduction in operation speed of the discharge driving unit 510 in the low-temperature environment.

When the internal power supply voltage generation unit operates to raise the level of the internal power supply voltage VINT, the PMOS transistor is turned on to raise the voltage level of the power-up detection node N_DET. At this time, the discharge drive of the power-up detection node N_DET by the NMOS transistor MN12 is continuously maintained. However, since the voltage raising abilities of the two PMOS transistors MP13 and MP14 are greater than the voltage lowering ability of the second NMOS transistor MN12, the voltage level of the power-up detection node N_DET increases.

When the voltage level of the power-up detection node N_DET increases to exceed the logic threshold value of the output unit 540, the power-up signal PUPBP changes to a logic high level.

However, since the threshold voltage Vth increases in the above-described low-temperature environment, the voltage raising ability of the charge driving unit 520 for the power-up detection node N_DET may decrease so as not to sufficiently raise the voltage level of the power-up detection node N_DET. The auxiliary charge driving unit is enabled in a low-temperature environment to additionally drive the power-up detection node N_DET. That is, in the low-temperature environment, the temperature information T_INFO is activated to a logic low level to turn on the PMOX transistor MP16. Accordingly, the two transistors MP15 and MP16 of the auxiliary charge driving unit 530 as well as the two PMOS transistors MP13 and MP14 of the charge driving unit 520 may sufficiently drive the power-up detection node N_DET to raise its voltage level.

Figure 7A:
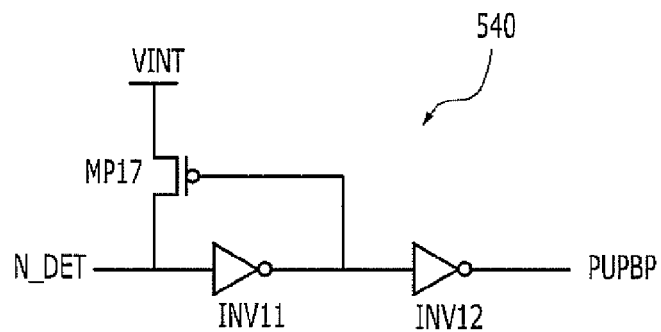
FIGS. 7A to 7C are diagrams illustrating examples of an output unit 540 of the power-up signal generation circuit.
Figure 7B:
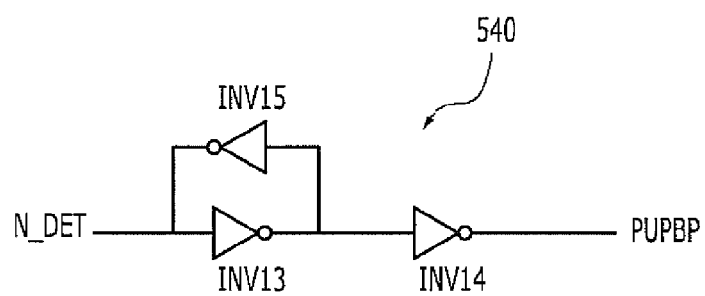
Figure 7C:
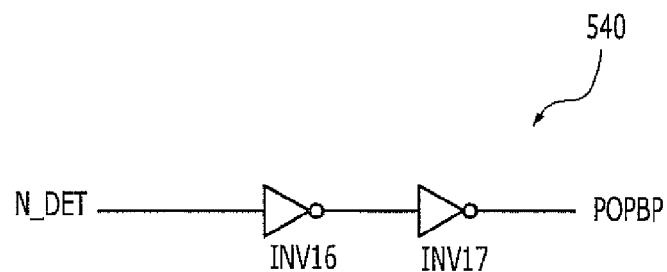

FIGS. 7A to 7C are diagrams illustrating examples of the output unit 540 of the power-up signal generation circuit.

Referring to FIG. 7A, the output unit 540 of the power-up signal generation circuit may include an inverter INV11, a PMOS transistor MP17, and an inverter INV12. The inverter INV11 has an input terminal connected to the power-up detection node D_DET. The PMOS transistor MP17 has a source connected to an internal power supply voltage terminal VINT, a drain connected to the power-up detection node N_DET, and a gate connected to the output terminal of the inverter INV11. The inverter INV12 receives an output signal of the INV11 and outputs a power-up signal PUPBP.

Furthermore, the two inverters INV11 and INV12 and the latch circuit implemented by the PMOS transistor MP17 may be replaced by three inverters INV13, INV14, and INV15, as illustrated in FIG. 7B.

When the output unit 540 is implemented, the latch circuit need not be necessarily used. Therefore, as illustrated in FIG. 7C, only two inverters INV16 and INV17 may be used to implement the output unit 540.

Figure 8:
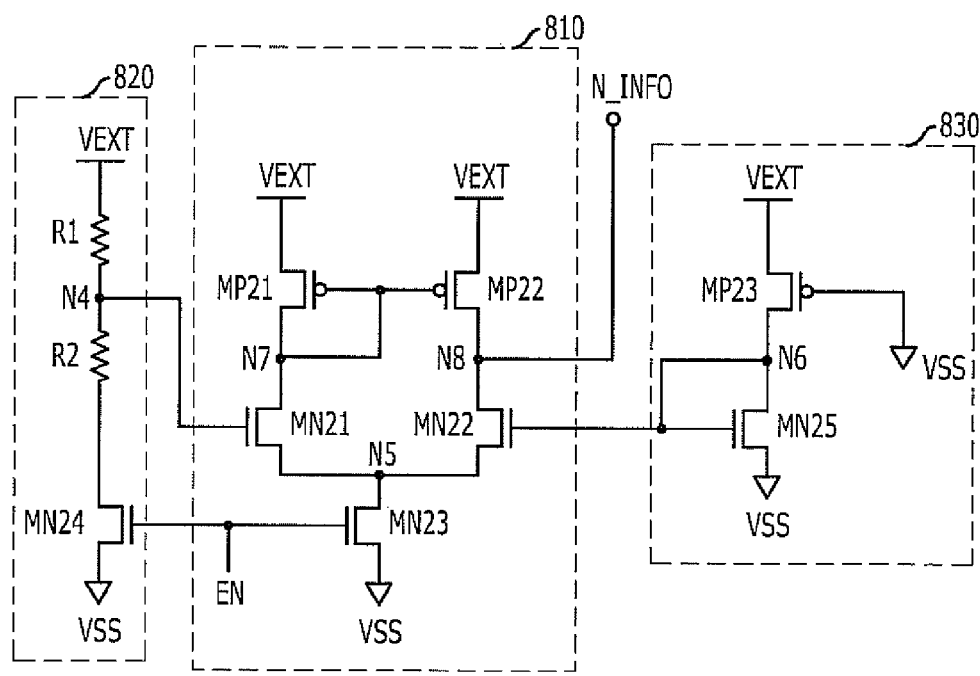
FIG. 8 is a diagram illustrating an example of a temperature detection unit for generating temperature information T_INFO.

FIG. 8 is a diagram illustrating an example of the temperature detection unit for generating the temperature information T_INFO.

Referring to FIG. 8, the temperature detection unit includes a first input unit 820, a second input unit 830, and a comparison unit 810. The first input unit 820 is configured to divide an external power supply voltage VEXT by a preset division ratio and to output the divided voltage. The second input unit 830 is configured to output a threshold voltage level corresponding to the temperature. The comparison unit 810 is configured to compare the output signal of the first input unit 820 with the output signal of the second input unit 830 and to output temperature information T_INFO.

The first input unit 820 includes a first resistor R1, a second resistor R2, and an NMOS transistor MN24. The first resistor R1 is connected between an external power supply terminal VEXT and an output node N4. The second resistor R2 has one terminal connected to the output node N4. The NMOS transistor MN24 has a source connected to a ground voltage terminal VSS and a drain connected to the other terminal of the second resistor R2 and receives a temperature detection enable signal EN through a gate thereof.

The second input unit 830 includes a PMOS transistor MP23 and an NMOS transistor MN25. The PMOS transistor MP23 has a source connected to an external power supply voltage VEXT and a drain connected to an output node N6, and receives a ground voltage VSS through a gate thereof. The NMOS transistor MN25 has a source connected to the ground voltage terminal VSS and a drain and gate connected to an output node N6.

The comparison unit 810 includes an NMOS transistor MN23, an NMOS transistor MN21, an NMOS transistor MN22, a PMOS transistor MP21, and a PMOS transistor MP22. The NMOS transistor MN23 has a source connected to a ground voltage terminal VSS and a drain connected to a node N5, and receives the temperature detection enable signal EN through a gate thereof. The NMOS transistor MN21 has a source connected to the node N5, a drain connected to a node N7, and a gate connected to the node 4. The NMOS transistor MN22 has a source connected to the node N5, a drain connected to a node N8 corresponding to a temperature information output terminal, and a gate connected to the node N6. The PMOS transistor MP21 has a source connected to an external power supply terminal VEXT and gate and drain connected to the node N7. The PMOS transistor MP22 has a source connected to an external power supply terminal VEXT, a drain connected to the node N8, and a gate connected to the node N7.

The comparison unit 810 compares the voltage levels of the nodes N4 and N6. The voltage of the node N4 changes according to the external power supply voltage VEXT and the resistance values of the first and second resistors R1 and R2, and the voltage of the node N6 has a constant value set to a threshold voltage Vth corresponding to the temperature.

During a power-up operation, when the level of the node N4 is lower than that of the node N6 at a normal temperature, the temperature information T_INFO maintains a logic low level. As the external power supply voltage VEXT increases, the voltage level of the node N4 increases. Then, when the voltage level of the node N4 becomes higher than that of the node N6, the temperature information T_INFO changes to a logic high level.

Since the threshold voltage Vth increases in the low-temperature environment, the instant of time when the voltage level of the node N4 becomes higher than that of the node N6 is delayed. That is, an interval in which the temperature information T_INFO is activated to a logic low level relatively lengthens.

Therefore, in the low-temperature environment, the enable interval of the auxiliary charge driving unit 530 and the auxiliary discharge control unit 30, which are controlled by the temperature information T_INFO, becomes longer than in a normal temperature environment. Accordingly, it is possible to perform the temperature compensation operation.

In accordance with the embodiments of the present invention, it is possible to prevent a malfunction of the semiconductor integrated circuit caused by a power-up signal generation error. In particular, the internal power supply voltage level may be accurately detected even in a low-temperature environment to normally generate a power-up signal.

While the present invention has been described with respect to the specific embodiments, it will be apparent to those skilled in the art that various changes and modifications may be made without departing from the spirit and scope of the present invention as defined by the following claims.

For example, the configuration of the above-described temperature detection unit may be modified in various manners, and the activation method of the temperature information T_INFO may be changed according to the temperature detection unit.

Furthermore, the types and number of logic and MOS transistors used in the above-described embodiments may be changed according to the active polarities of input/output signals.

What is claimed is:
1. A power-up signal generation circuit of a semiconductor device, comprising:
    a discharge driving unit configured to lower a voltage of a power-up detection node according to an external power supply voltage level;
    a charge driving unit configured to raise a voltage of the power-up detection node according to an internal power supply voltage level;

an auxiliary charge driving unit configured to additionally raise a voltage of the power-up detection node according to temperature information; and an output unit configured to output a first power-up signal in response to a voltage change of the power-up detection node, wherein the discharge driving unit comprises:
a discharge control unit configured to control a voltage lowering start time according to the external power supply voltage level;
a driving unit configured to lower a voltage of the power-up detection node through control of the discharge control unit; and
an auxiliary discharge control unit configured to advance the voltage lowering start time in a low-temperature environment according to the temperature information.

2. The power-up signal generation circuit of claim 1, wherein the auxiliary driving unit advances the voltage lowering start time in response to preset temperature information indicating the low-temperature environment.

3. The power-up signal generation circuit of claim 1, wherein the auxiliary driving unit advances the voltage lowering start time for an increased interval in response to the temperature being lower than a preset normal temperature.

4. The power-up signal generation circuit of claim 1, wherein the charge driving unit comprises:
a first PMOS transistor having a source connected to an internal power supply voltage terminal and a drain and gate connected to a first node; and
a second PMOS transistor having a source connected to the first node and a drain connected to the power-up detection node, and receiving a ground voltage through a gate thereof.

5. The power-up signal generation circuit of claim 1, wherein the discharge driving unit comprises:
a first PMOS transistor having a source connected to an external power supply voltage terminal and a drain connected to a control node, and receiving a ground voltage through a gate thereof;
a first NMOS transistor having a source connected to a ground voltage terminal and a drain and gate connected to the control node;
a second NMOS transistor having a source connected to the ground voltage terminal, a drain connected to the power-up detection node, and a gate connected to the control node; and
a second PMOS transistor having a source connected to the external power supply voltage terminal and a drain connected to the control node, and receiving the temperature information through a gate thereof.

6. The power-up signal generation circuit of claim 1, further comprising a temperature detection unit configured to output the temperature information.

7. The power-up signal generation circuit of claim 6, wherein the temperature detection unit comprises:
a first input unit configured to divide the external power supply voltage by a preset division ratio and to output the divided voltage;
a second input unit configured to output a threshold voltage level corresponding to the temperature; and
a comparison unit configured to compare the output signal of the first input unit with the output signal of the second input unit and to output the temperature information.

8. The power-up signal generation circuit of claim 7, wherein the first input unit comprises:
a first resistor connected between an external power supply voltage terminal and a first output node;
a second resistor having one terminal connected to the first output node; and
a first NMOS transistor having a source connected to a ground voltage terminal and a drain connected to the other terminal of the second resistor, and receiving a temperature detection enable signal through a gate thereof.

9. The power-up signal generation circuit of claim 8, wherein the second input unit comprises:
a PMOS transistor having a source connected to the external power supply voltage terminal and a drain connected to a second output node, and receiving a ground voltage through a gate thereof; and
a second NMOS transistor having a source connected to the ground voltage terminal and a drain and gate connected to the second output node.

10. The power-up signal generation circuit of claim 1, wherein the output unit comprises:
a first inverter having an input terminal connected to the power-up detection node;
a PMOS transistor having a source connected to an internal power supply voltage terminal, a drain connected to the power-up detection node, and a gate connected to an output terminal of the first inverter; and
a second inverter configured to receive the output signal of the first inverter and to output the power-up signal.

11. The power-up signal generation circuit of claim 1, wherein the output unit comprises:
a first inverter having an input terminal connected to the power-up detection node;
a second inverter having an input terminal connected to an output terminal of the first inverter and an output terminal connected to the power-up detection node; and
a third inverter configured to receive the output signal of the first inverter and to output the power-up signal.

12. The power-up signal generation circuit of claim 1, wherein the output unit comprises:
a first inverter having an input terminal connected to the power-up detection node; and
a second inverter configured to receive the output signal of the first inverter and to output the power-up signal.

13. A power-up signal generation circuit of a semiconductor device, comprising:
a discharge driving unit configured to lower a voltage of a power-up detection node according to an external power supply voltage level;
a charge driving unit configured to raise a voltage of the power-up detection node according to an internal power supply voltage level;
an auxiliary charge driving unit configured to additionally raise a voltage of the power-up detection node according to temperature information; and
an output unit configured to output a first power-up signal in response to a voltage change of the power-up detection node, wherein the auxiliary charge driving unit is further configured to advance a voltage lowering start time for an increased interval in response to the temperature information indicating a temperature lower than a preset normal temperature, wherein the auxiliary charge driving unit comprises:
a first PMOS transistor having a source connected to an internal power supply voltage terminal and a drain and gate connected to a first node; and
a second PMOS transistor having a source connected to the first node and a drain connected to the power-up detection node, and receiving the temperature information through a gate thereof.

* * * * *